United States Patent [19]
Marshall

[11] Patent Number: 6,147,545
[45] Date of Patent: *Nov. 14, 2000

[54] BRIDGE CONTROL CIRCUIT FOR ELIMINATING SHOOT-THROUGH CURRENT

[75] Inventor: Andrew Marshall, Dallas, Tex.

[73] Assignee: Texas Instruments Incorporated, Dallas, Tex.

[*] Notice: Under 35 U.S.C. 154(b), the term of this patent shall be extended for 1089 days.

[21] Appl. No.: 08/642,811

[22] Filed: May 3, 1996

Related U.S. Application Data

[63] Continuation of application No. 08/496,116, Jun. 27, 1995, abandoned, which is a continuation of application No. 08/207,500, Mar. 8, 1994, abandoned.

[51] Int. Cl.[7] .................................................. H03K 17/16
[52] U.S. Cl. ...................... 327/424; 327/410; 327/391; 327/110; 326/28; 363/56
[58] Field of Search ................................. 363/56; 327/84, 327/92, 108, 109, 110, 408, 409, 410, 482, 484, 579, 588, 587, 494, 112, 423, 424, 384, 389, 391; 326/27, 28

[56] References Cited

U.S. PATENT DOCUMENTS

| | | | |
|---|---|---|---|
| 4,021,684 | 5/1977 | Macey | 327/579 |
| 4,796,145 | 1/1989 | Oshikiri | 363/56 |
| 5,057,720 | 10/1991 | Hattori | 307/571 |
| 5,099,138 | 3/1992 | Fukunaga | 327/109 |
| 5,257,175 | 10/1993 | Skelton et al. | 363/56 |
| 5,291,069 | 3/1994 | Gooding et al. | 327/482 |
| 5,309,347 | 5/1994 | Poma et al. | 363/56 |
| 5,408,150 | 4/1995 | Wilcox | 327/427 |

*Primary Examiner*—Timothy P. Callahan
*Assistant Examiner*—Terry L. Englund
*Attorney, Agent, or Firm*—Rose Alyssa Keagy; Carlton H. Hoel; Frederick J. Telecky, Jr.

[57] ABSTRACT

A bridge circuit uses active feedback to control drive phase turn on to substantially eliminate shoot-through current. Voltage sensor 66 senses H-bridge transistor voltage turn off levels and causes control circuit 64 to latch which causes enable circuit 62 to allow the next phase of H-bridge transistor turn on. A critical aspect of the invention is to ensure all H-bridge transistors are off before the enable circuit allows the next phase to turn any H-bridge transistors on.

4 Claims, 3 Drawing Sheets

BRIDGE CONTROL CIRCUIT FOR ELIMINATING SHOOT-THROUGH CURRENT

This application is a Continuation of application Ser. No. 08/496,116, filed Jun. 27, 1995 now abandoned, which is a continuation of 08/207,500, filed Mar. 8, 1994 and now abandoned.

FIELD OF THE INVENTION

The present invention relates to electrical circuits and more particularly to output buffer circuits of the H-bridge or ½ H-bridge circuit varieties.

BACKGROUND OF THE INVENTION

Bridge circuits are typically used to drive bidirectional motors. FIG. 1 shows a conventional output buffering H-bridge circuit composed of four N-channel MOS transistors 2, 4, 6, and 8. The first output terminal 22 is connected to the second output terminal 24 through an inductor load 20. Control circuit 10 has a terminal for the power source 26, a ground terminal 28 and an input terminal 30. Control circuit feeds input terminals 12, 14, 16, and 18.

In most prior art H-bridge circuits, input terminals 12 and 18 are tied together and additionally input terminals 14 and 16 are tied together. When there is a high voltage level on 12 and 18, the first N-channel MOS transistor 2 and the fourth N-channel MOS transistor 8 becomes conductive. As a result the potential of output terminal 22 approaches about Vbat (supply voltage from battery) while the potential of output terminal 24 approaches 0V. Conversely, when the potential of the internal input terminals 14 and 16 go high, the second N-channel MOS transistor 6 and the third N-channel MOS transistor 4 become conductive. As a result the potential of the first output terminal 22 approaches about 0V while the potential of the second output terminal 24 approaches about Vbat.

In FIG. 1, the turn-off switching speed of the MOS transistors are slow compared with the turn-on switching speed of the MOS transistors. Therefore, MOS transistor 2 on the power source side and MOS transistor 4 on the ground side both become conductive for a short period of time and a shoot-though current flows from Vbat terminal 26 to ground terminal 28 through MOS transistors 2 and 4. When the shoot-through current flows in the H-bridge circuit the amount of consumed electricity in the H-bridge circuit increases and an undesirable large current spike is produced at power terminal 26 and ground terminal 28 which can cause system noise. Another disadvantage of shoot-through current is increased radio frequency interference which causes additional thermal dissipation in the output structure and loading on the power supply.

A solution for reducing shoot-through current is shown in U.S. Pat. No. 5,057,720 illustrated in FIG. 2. In this circuit there are two additional MOS transistors 14 and 15 which are connected to the H-bridge, which is comprised of MOS transistors 5, 6, 7 and 8. MOS transistor 8 is connected to the H-bridge in a manner that allows quick discharge from transistor 5 through transistor 14 when transistor 8 becomes nonconductive. Conversely, when the transistor 6 becomes nonconductive, transistor 15 becomes conductive resulting in a quick discharge from the gate of transistor 7 through transistor 15.

With the prior art configuration of FIG. 2, the amount of shoot-through current becomes smaller due to reduced turn-off time. However, several disadvantages still exist. One disadvantage of this configuration is that it requires a full H-bridge circuit; it cannot be used with a half H-bridge circuit. Another disadvantage is the required sensing of the turn-on of an opposite phase. The circuit assumes that transistors 5 and 8 are being turned on while transistors 6 and 7 are being turned off or vice versa. This circuit does not accommodate situations where the transistors 5 and 6 are being turned on while transistors 7 and 8 are being turned off or vice versa.

SUMMARY OF THE INVENTION

The H-bridge circuitry of the present invention uses active output bridge sensing circuitry to feedback to the control circuit the point in which the output devices can switch. Output device turnoff is detected and used to enable turn on of the next phase of drive sequence. The control circuitry turns off all transistors of the H-bridge circuit during switching to prevent shoot-through current across the transistors of the H-bridge circuit. Once all transistors of the H-bridge are turned off, the control circuitry turns on one or more H-bridge transistors, as indicated by the input signals.

DETAILED DESCRIPTION OF PREFERRED EMBODIMENT

Figure 3:
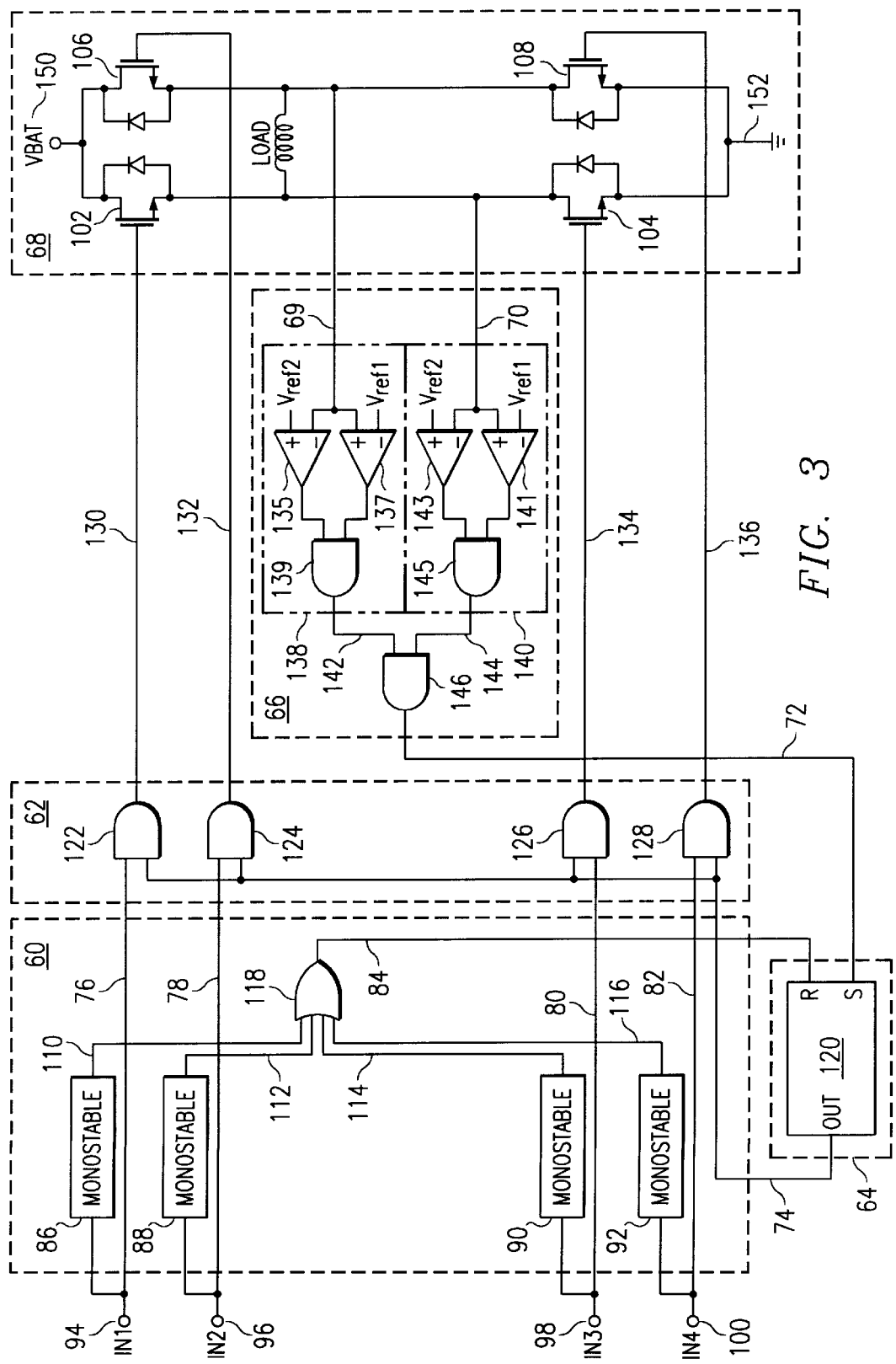
FIG. 3 is a logic block diagram of the present invention.

FIG. 3 shows the invention in logic block form. The H-bridge circuitry is contained in block 68. Block 66 contains voltage sensor circuitry which receives inputs from block 68 on lines 69 and 70. Block 66 sends an output signal on line 72 to control circuitry block 64. Control circuitry block 64 also receives an input on line 84 from reset circuitry block 60. The output 74 of control circuitry block 64 is an input to enable circuitry block 62. Enable circuitry block 62 also receives as inputs the outputs 76, 78, 80, and 82 of reset block 60.

In FIG. 3, reset block 60 contains monostable multivibrators 86, 88, 90, and 92 which function as one-shots. The inputs to monostables 86, 88, 90, and 92 are inputs 94, 96, 98, and 100 respectively. A high signal on any of inputs 94, 96, 98, or 100 indicates that a transistor in H-bridge 68 is to be turned on. Control circuitry, which is not shown, feeds the correct sequence of signals for bridge operations into inputs 94, 96, 98, and 100. Specifically when input 94 is high then transistor 102 will be turned on, when input 96 is high then transistor 106 will be turned on, when input 98 is high then transistor 104 will be turned on, and when input 100 is high then transistor 108 will be turned on. Monostable outputs 110, 112, 114, and 116 form inputs to OR gate 118. The output of OR gate 118 is connected to the Reset input 84 of the RS flip-flop 120 of control circuitry block 64.

In FIG. 3, enable block 62 contains AND gates 122, 124, 126, and 128 which receive inputs on lines 76, 78, 80, and 82 from reset block 60. These AND gates also receive as an input on line 74 the output of control circuitry block 64. The outputs 130, 132, 134, and 136 of the enable block 62 are connected to the gates of transistors 102, 106, 104, and 108 respectively of H-bridge block 68.

In FIG. 3, outputs 69 and 70 of the H-bridge block 68 are the inputs to comparators 138 and 140 respectfully of voltage sensor block 66. The outputs 142 and 144 of comparators 138 and 140 are input into AND gate 146 of voltage sensor block 66. Output 72 of AND gate 146 is connected to the Set input of the RS flip-flop 120 of control circuitry block 64.

In operation, FIG. 3 advantageously switches a selected transistor, for example 102, on only after the voltage sensor circuitry 66 has signaled to control circuitry 64 that all transistors of the H-bridge are off to prevent shoot-through current. This minimizes switching delay and provides less risk of shoot-through under extreme conditions of process or temperature.

The operation of FIG. 3 will be explained using as an example a situation where the circuit is operating with transistor 102 on and further where it is desired to switch to transistor 104 on. Input 94 will be a zero and input 98 will be a one. When input 98 receives the logic one level then monostable 90 is triggered and a reset signal is sent to RS flip-flop 120 by OR gate 118. RS flip-flop 120 will now send signals through AND gates 122, 124, 126, and 128 to turn transistors 102, 104, 106, and 108 off. As transistor 102 goes off the voltage at line 70 will approach Vbat/2 (the voltage on line 70 is divided between transistors 102 and 104).

Comparators 135 and 137, as well as AND gate 139, collectively comprise the two level comparator 138. Similarly, comparators 141 and 143, as well as AND gate 145, collectively comprise the two level comparator 140. Looking first at the operation of comparator 140: when the source output of 102/drain output of 104 is at a voltage level between $V_{ref1}$ and $V_{ref2}$ then there will be high voltages output from comparators 141 and 143 into AND gate 145. The result is that AND gate 145 will output a logic high voltage into AND gate 146. The comparator 138 operates in a manner similar to comparator 140. Therefore, when the output of comparators 138 and 140 are both high, than the AND gate 146 outputs a logic high voltage. In summary, comparators 138 and 140 will trigger when the voltage on lines 69 and 70 reach a predetermined level which in this embodiment is about one volt away from Vbat or GND. When signals 69 and 70 are within that desired voltage level, AND gate 146 will send a signal to the Set input of RS flip-flop 120 signifying that transistors 102, 104, 106, and 108 are sufficiently off to prevent shoot-through current. Once the set signal is received by RS flip-flop 120, the high input on 98 will cause AND gate 126 to send a signal to the gate of transistor 104 which turns transistor 104 on.

Figure 4:
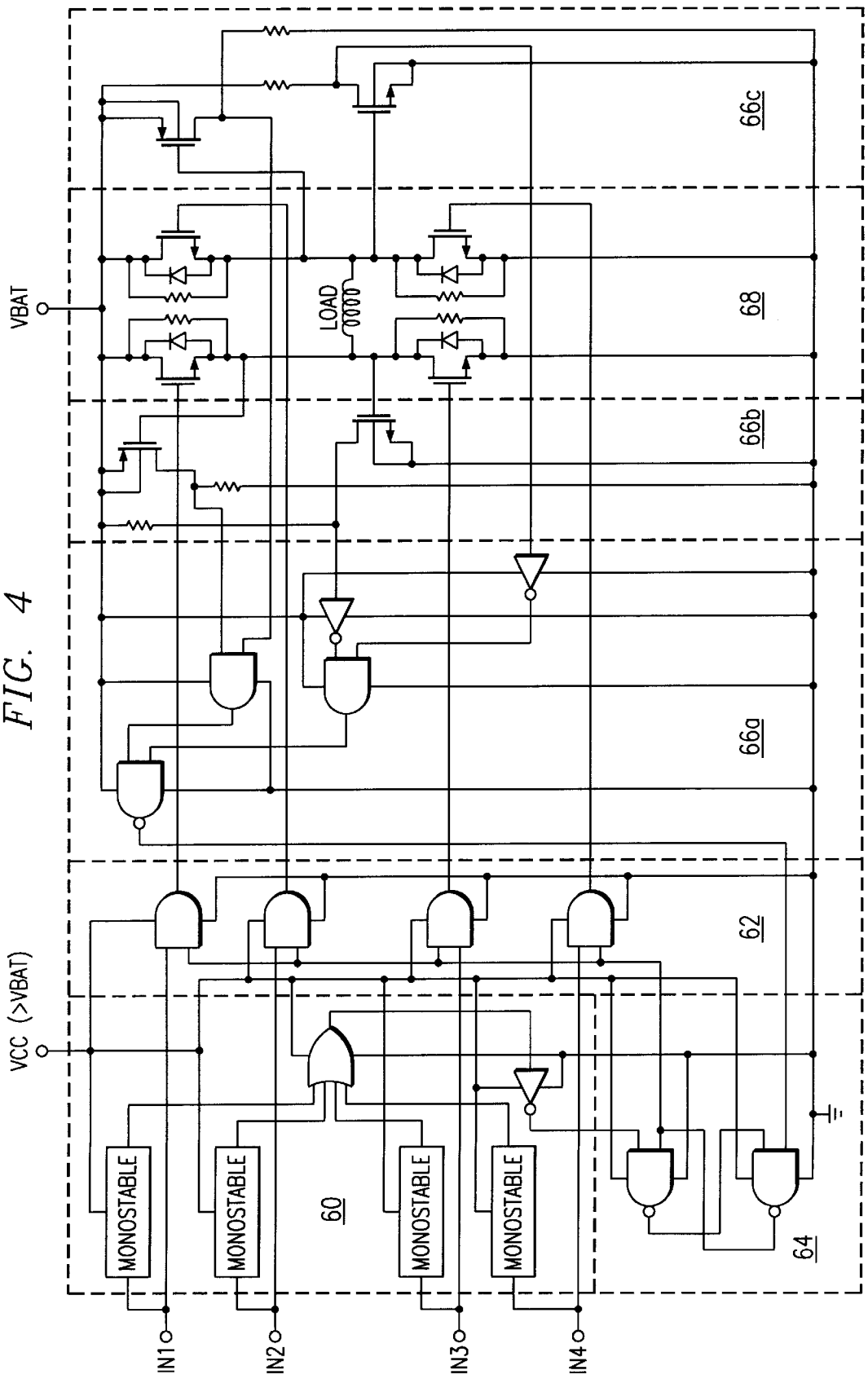
FIG. 4 is a circuit diagram of FIG. 3.

In other words, during turnoff, the voltage at the output will adjust from approximately Vbat to Vbat/2, due to the resistive divider (shown in FIG. 4). When the voltage has reduced a predetermined value from Vbat a logic signal is "ANDED" with similar detection elements across each of the MOS output transistors. When all outputs are inside their predetermined voltage levels, indicating no outputs remain conducting, a signal is latched into latch 120, which allows the next drive phase to be implemented.

FIG. 4 shows a circuit diagram corresponding to the logic diagram of FIG. 3. The block numbers used in FIG. 3 are repeated in FIG. 4 to signify the corresponding circuitry between the two figures. Block 66a represents the comparator AND gate 146, block 66b represents the comparator 140, and block 66c represents the comparator 138 of FIG. 3.

Figure 1:
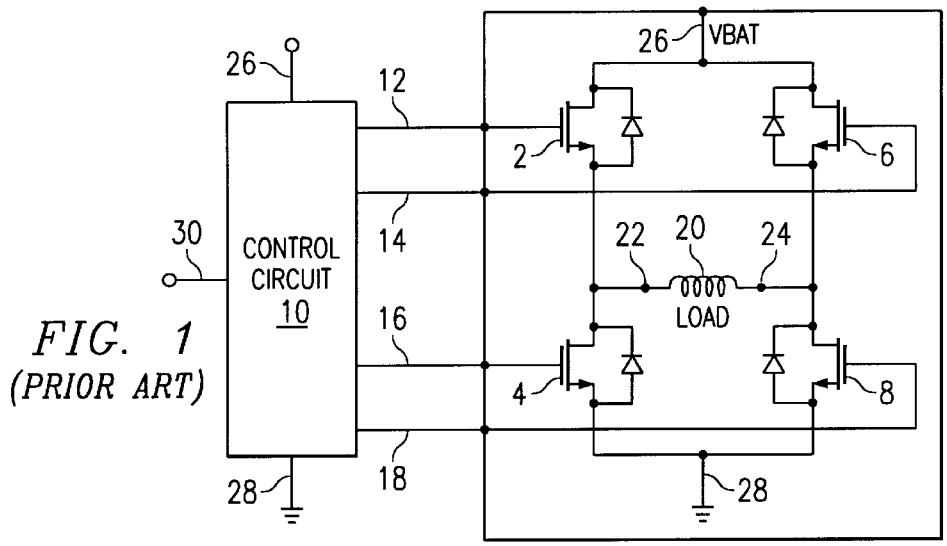
FIG. 1 is a generic output buffering circuit which uses an H-bridge circuit to control a load such as a motor.
Figure 2:
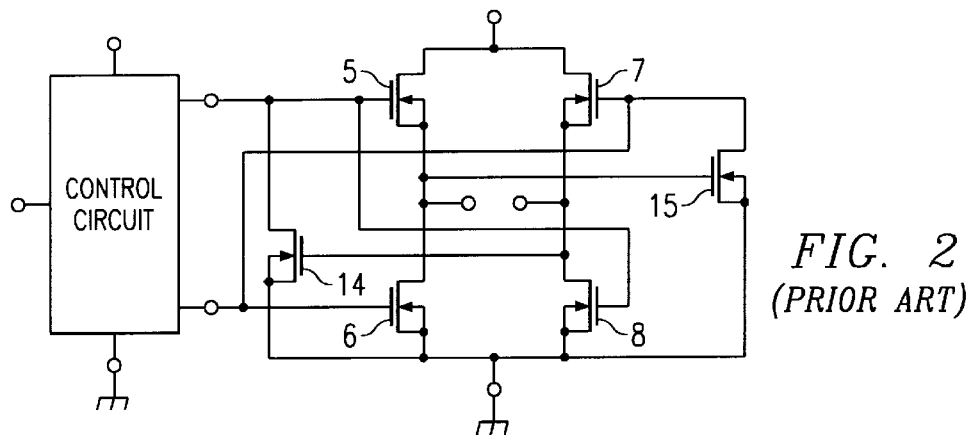
FIG. 2 is a prior art circuit for reducing shoot-through current.
Figure 5:
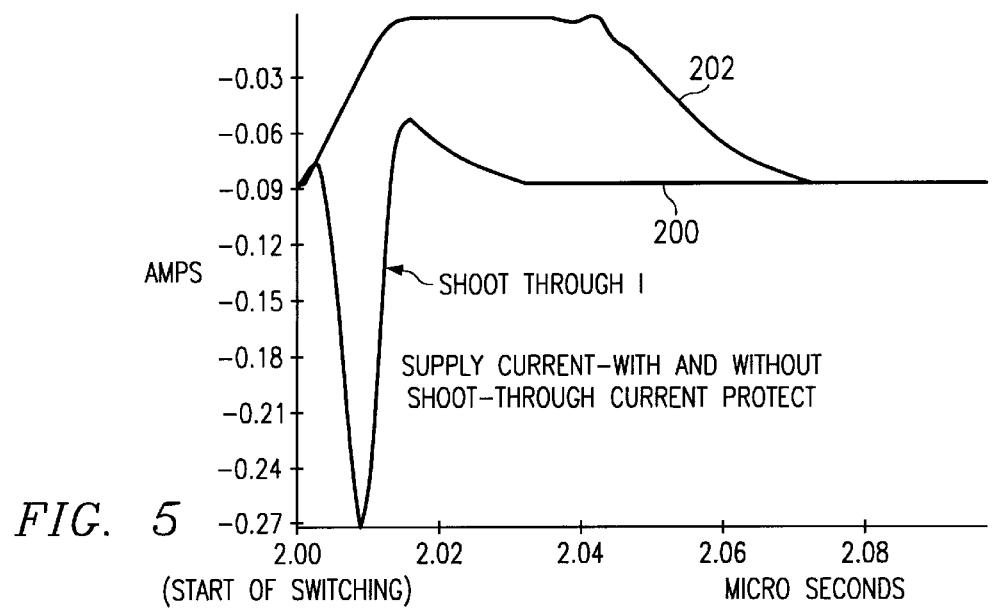
FIG. 5 is a current diagram showing the current levels through Vbat with and without the shoot-through protection of the present invention.

FIG. 5 shows the supply current levels improvement of FIGS. 3 and 4 over time as transistors 102 and 108 are switched off while transistors 104 and 106 are being switched on, or vice versa. The switch over occurs at time 2.00 micro seconds in the graph shown. Without shoot-through protection the graph shows that the current on 200 is 0.270 amps (which would pump across transistors 102 and 104 or through 106 and 108). This is about three times the normal load current. However, with the shoot-through current protection provided by the invention herein, shown in 202, the current goes almost to 0.000 amps. Thus by turning off all outputs for a short period of time, about 40 nanoseconds in this case, the current level goes to zero and shoot-through is avoided during switching.

Modifications and variations of the invention are possible in light of the above teachings while remaining within the scope of the appended claims. For instance, the circuitry of the present invention can be used with half H-bridge circuitry.

What is claimed is:

1. A bridge control circuit for substantially eliminating shoot-through current comprising:

an H-bridge circuit;

active feedback circuitry coupled to said H-bridge circuit to detect a predetermined half H-bridge output voltage level, and upon said detection enabling turn on of next phase of a drive sequence wherein said H-bridge circuit comprises one or more transistors having output terminals, and wherein the active feedback circuitry comprises:

voltage sensor circuitry coupled to said H-bridge circuitry which detects when all of said output terminals of said transistors of said H-bridge circuitry are at said predetermined voltage level and upon said detection outputs a set signal;

control circuitry coupled to said voltage sensor circuitry for sending a disable signal to turn all said H-bridge circuitry transistors off upon the receipt of a reset signal; said control circuitry also sends an enable signal upon receipt of said set signal from said voltage sensor;

reset circuitry coupled to said control circuitry for receiving input signals signifying which transistors in said H-bridge circuitry are to turn on and which transistors in said H-bridge circuitry are to be tuned off, said reset circuitry outputs said reset signal when any of said input signals have changed logic levels, said reset circuitry also outputs said input signals; and enable circuitry coupled to said reset circuitry and to said control circuitry for outputting a respective transistor enable signal to selected H-bridge transistors upon the receipt of said enable signal from said control circuitry.

2. The circuit of claim 1 wherein said control circuit includes a latch.

3. The circuit of claim 2 wherein said reset circuitry includes a monostable multivibrator.

4. The circuit of claim 3 wherein said voltage sensor circuitry comprises:

a first comparator for determining when a first half of said H-bridge circuitry transistors are at said predetermined turn off voltage level, said determination made by comparing an output voltage of said output terminals of said transistors of said first half H-bridge to reference voltages;

a second comparator for determining when a second half of said H-bridge circuitry transistors are at said predetermined turn off voltage level, said determination made by comparing an output voltage of said output terminals of said transistors of said second half H-bridge to said reference voltages; and an AND gate coupled to said first and second comparators, for outputting said set signal when said first and second comparators have determined that all said H-bridge circuitry transistors are at said predetermined voltage level.

* * * * *